(12) United States Patent
Singh

(10) Patent No.: US 8,487,178 B2
(45) Date of Patent: Jul. 16, 2013

(54) ALKALINE EARTH FILLED NICKEL SKUTTERUDITE ANTIMONIDE THERMOELECTRICS

(75) Inventor: David Joseph Singh, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 225 days.

(21) Appl. No.: 13/006,499

(22) Filed: Jan. 14, 2011

(65) Prior Publication Data

US 2012/0180841 A1   Jul. 19, 2012

(51) Int. Cl.
*H01L 35/18* (2006.01)
*H01L 35/14* (2006.01)

(52) U.S. Cl.
USPC ......... 136/240; 136/236.1; 136/205; 136/203

(58) Field of Classification Search
USPC ................ 136/240, 236.1, 205, 203
See application file for complete search history.

(56) References Cited

U.S. PATENT DOCUMENTS

| | | | |
|---|---|---|---|
| 5,747,728 A * | 5/1998 | Fleurial et al. ............... 136/203 |
| 5,994,639 A | 11/1999 | Johnson et al. |
| 6,660,926 B2 | 12/2003 | Fleurial et al. |
| 7,476,892 B2 | 1/2009 | Suh et al. |
| 7,648,552 B2 | 1/2010 | Yang et al. |
| 7,723,607 B2 | 5/2010 | Subramanian et al. |
| 7,728,218 B2 | 6/2010 | Snyder et al. |
| 2006/0249724 A1 | 11/2006 | Krusin-Elbaum et al. |
| 2008/0023057 A1 | 1/2008 | Nakajima et al. |
| 2009/0208364 A1 | 8/2009 | Berardan et al. |
| 2009/0211619 A1 * | 8/2009 | Sharp et al. ............... 136/240 |
| 2009/0293930 A1 | 12/2009 | Yang et al. |
| 2010/0071741 A1 | 3/2010 | Yang et al. |

OTHER PUBLICATIONS

Singh et al., "Properties of alkaline-earth-filled skutterudite antimonides: A(Fe,Ni)4Sb12 (A=Ca, Sr, and Ba)", Physical Review B 82, 075115 (2010).*

Eiichi Matsuoka, Katsuyuki Hayashi, Akiko Ikeda, Kazue Tanaka, Toshiro Takabatake and Masahiro Matsumura, "Nearly Ferromagnetic Metals AFe4Sb12 (A=Ca, Sr, and Ba)", J. Phys. Soc. Jpn., vol. 74, No. 5, May 2005, pp. 1382-1385.

* cited by examiner

*Primary Examiner* — Golam Mowla
(74) *Attorney, Agent, or Firm* — Warner Norcross & Judd LLP

(57) ABSTRACT

A thermoelectric material including a body centered cubic filled skutterudite having the formula $A_xFe_yNi_zSb_{12}$, where A is an alkaline earth element, x is no more than approximately 1.0, and the sum of y and z is approximately equal to 4.0. The alkaline earth element includes guest atoms selected from the group consisting of Be, Mb, Ca, Sr, Ba, Ra and combinations thereof. The filled skutterudite is shown to have properties suitable for a wide variety of thermoelectric applications.

20 Claims, 6 Drawing Sheets

ALKALINE EARTH FILLED NICKEL SKUTTERUDITE ANTIMONIDE THERMOELECTRICS

This invention was made with government support under Contract No. DE-AC05-00OR22725 awarded by the U.S. Department of Energy. The government has certain rights in the invention.

BACKGROUND OF THE INVENTION

The present invention relates to thermoelectric materials, and more particularly, thermoelectric materials including a filled skutterudite structure.

Thermoelectric materials are a class of materials that efficiently convert thermal energy to electrical energy or convert electrical energy into thermal energy. The "Seebeck effect" is the phenomenon underlying the conversion of thermal energy into electrical energy, while the "Peltier effect" is the phenomenon underlying the conversion of electrical energy into thermal energy. In power generation applications, for example, thermoelectric materials typically include free electrons or free electron holes that create an internal electric field in the presence of a temperature gradient. The internal electric field results in a buildup of voltage between two electrodes to provide a source of electrical power.

The performance of thermoelectric materials is generally characterized by a dimensionless figure of merit, $ZT = \sigma S^2 T/\kappa$, where $\sigma$ is the electrical conductivity, S is the Seebeck coefficient, T is the temperature, and $\kappa$ is the thermal conductivity. The larger the value of ZT, the higher the efficiency of the thermoelectric material. An efficient thermoelectric material should therefore possess a high electrical conductivity, a large Seebeck coefficient, and a low thermal conductivity. While there are no known upper limits to the value of ZT, in practice materials having a value of ZT greater than one are rare.

Filled skutterudites represent a class of artificially or naturally structured thermoelectric materials having good electrical conductivity, modest to high Seebeck coefficients, and low thermal conductivity. Filled skutterudites are structurally related to the mineral skutterudite, $CoAs_3$, but contain guest atoms in the interstitial voids in its crystalline structure. One such category of filled skutterudites, rare earth filled skutterudite, is represented by the formula $R_xT_4Sb_{12}$, where R is a rare earth element, x is a guest fraction, and T is Iron (Fe), Cobalt (Co), or a mixture of these elements. Rare earth filled skutterudites have been shown to exhibit a lower thermal conductivity, $\kappa$, and thus a higher figure of merit, ZT, when compared to unfilled skutterudites and other thermoelectric materials. As a result, rare earth filled skutterudites have been proposed as a thermoelectric material for thermoelectric power generators, solid state thermoelectric coolers, and solid state thermoelectric heaters.

Despite the advantages of rare earth filled skutterudites, the relatively high cost of component materials contributes to their overall high cost. Therefore, there remains a need for an improved, low-cost filled skutterudite suitable across a wide range of thermoelectric applications.

SUMMARY OF THE INVENTION

The present invention provides an alkaline earth filled nickel skutterudite antimonide having a body centered cubic structure with a space group Im3 according to the formula $A_xFe_yNi_zSb_{12}$. According to the above formula, A is an alkaline earth element, x is not more than approximately 1.0, and the sum of y and z is approximately 4.0. The alkaline earth element, A, represents guest atoms in the interstitial voids in the skutterudite structure, where A is selected from the group consisting of Be, Mg, Ca, Sr, Ba, Ra and combinations thereof. $Fe_yNi_z$ represents the transition metal atoms for controlling the valence count and retaining the semiconductor character of the skutterudite structure, with y optionally being equal to 3.0 and z optionally being equal to 1.0.

In another embodiment of the invention, a thermoelectric material is provided, the thermoelectric material having a body centered cubic structure with a space group Im3 according to the formula $A1_{x1}A2_{x2}Fe_yNi_zSb_{12}$. According to this formula, A1 and A2 are alkaline earth elements and the sum of x1 and x2 is not more than approximately 1.0. A1 can include a first alkaline earth element and A2 can include a second alkaline earth element different from the first alkaline earth element, where A1 and A2 are selected from the group consisting of Be, Mg, Ca, Sr, Ba, Ra and combinations thereof. $Fe_yNi_z$ represents the transition metal atoms, where the sum of y and z is approximately 4.0.

In another embodiment of the invention, a thermoelectric material is provided, the thermoelectric material having a body centered cubic structure with a space group Im3 according to the formula $A1_{x1}A2_{x2}A3_{x3}Fe_yNi_zSb_{12}$. According to this formula, A1, A2 and A3 are alkaline earth elements and the sum of x1, x2 and x3 is not more than approximately 1.0. A1, A2 and A3 each represent different alkaline earth elements selected from the group consisting of Be, Mg, Ca, Sr, Ba, Ra and combinations thereof. $Fe_yNi_z$ represents the transition metal atoms, where the sum of y and is approximately 4.0.

In another embodiment of the invention, a thermoelectric device is provided, the thermoelectric device including first and second heat transfer plates spaced apart from each other and n-type and p-type thermoelectric semiconductors therebetween, the n-type and p-type thermoelectric semiconductors being electrically connected in series and thermally connected in parallel. At least one of the n-type and p-type thermoelectric semiconductors are represented by the formula, $A_xFe_yNi_zSb_{12}$, where A is an alkaline earth element, x is not more than approximately 1.0, and the sum of y and z is approximately 4.0. In another embodiment, at least one of the n-type and p-type thermoelectric semiconductors is designated by the formula $A1_{x1}A2_{x2}Fe_yNi_zSb_{12}$, where A1 and A2 are alkaline earth elements, the sum of x1 and x2 is not more than 1.0, and the sum of y and z is approximately 4.0. In still another embodiment, at least one of the n-type and p-type thermoelectric semiconductors is designated by the formula $A1_{x1}A2_{x2}A3_{x3}Fe_yNi_zSb_{12}$, where A1, A2 and A3 are alkaline earth elements, the sum of x1, x2 and x3 is not more than 1.0, and the sum of y and z is approximately 4.0. The thermoelectric device can suitably provide a source of electrical power when subject to a temperature gradient across the first and second heat transfer plates, and can provide a solid state thermoelectric cooler or heater when a DC voltage is applied across the n-type and p-type thermoelectric semiconductors.

Embodiments of the present invention can achieve high thermoelectric performance at lower cost when compared with unfilled and rare earth filled skutterudites. In addition, the use of nickel in place of cobalt can lower the material costs of the filled skutterudite, as a semiconducting composition can be reached with less nickel than cobalt. The alkaline earth filled skutterudite can be effectively utilized as n-type and p-type semiconductors in any number of thermoelectric applications, including applications involving waste heat recovery from engines or industrial sources, solar thermal electrical power generation and solid state memory devices.

These and other features and advantages of the present invention will become apparent from the following description of the invention, when viewed in accordance with the accompanying drawings and appended claims.

DETAILED DESCRIPTION OF THE CURRENT EMBODIMENT

The invention as contemplated and disclosed herein includes a stable cubic alkaline earth filled skutterudite. In particular, the present invention includes an alkaline earth filled nickel skutterudite antimonide which can be utilized as an n-type or p-type thermoelectric semiconductor across a wide range of applications.

Figure 1:
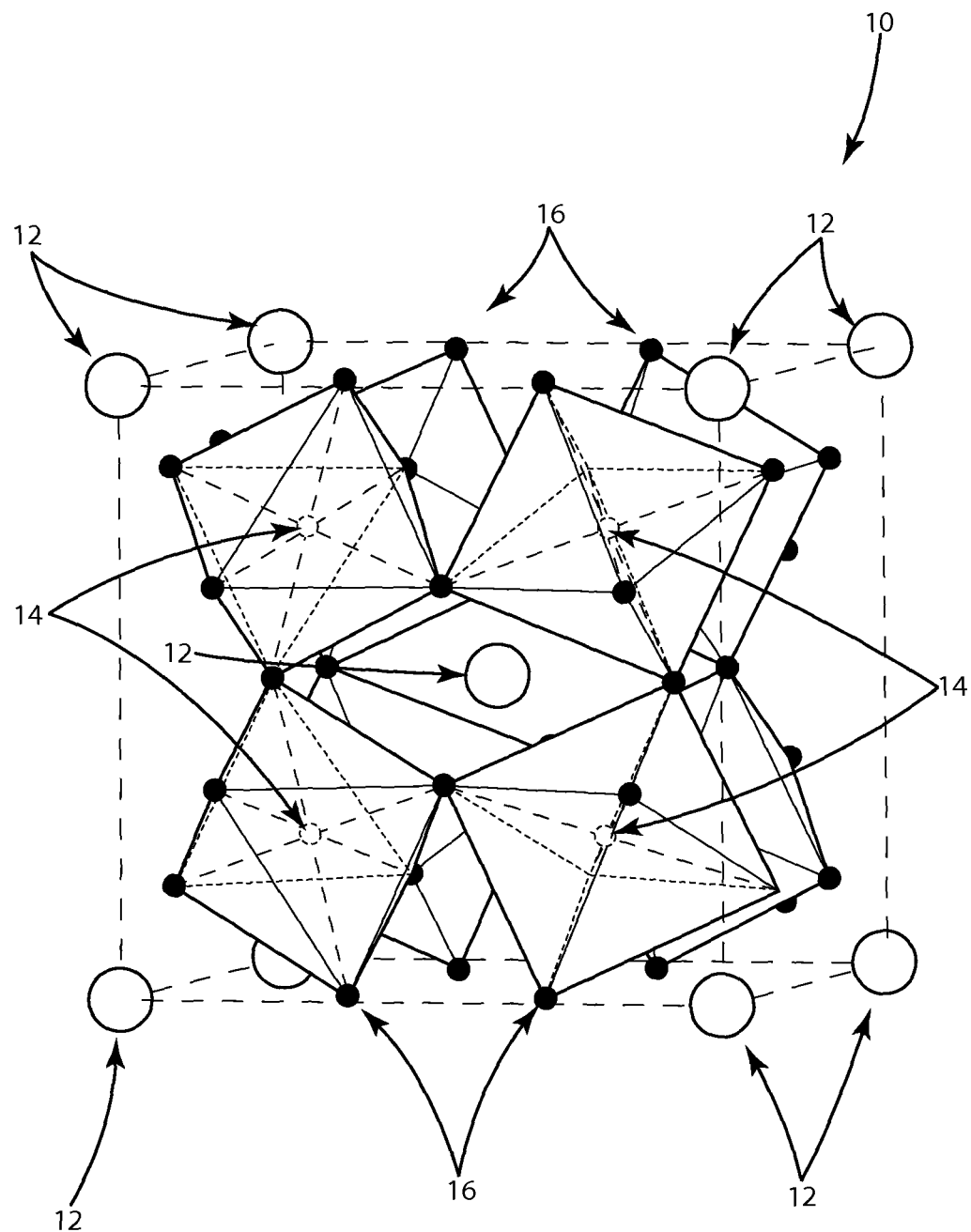
FIG. 1 is a schematic perspective representation of a skutterudite body centered crystal structure having the formula $A_xFe_yNi_zSb_{12}$.

Referring to FIG. 1, a schematic illustration of the crystalline structure of an improved filled skutterudite according to the present invention is generally indicated by reference numeral 10. The filled skutterudite 10 includes a body centered cubic structure with a space group Im3. The filled skutterudite 10 includes several voids interstitially defined therein, where such voids are filled with alkaline earth guest atoms 12 selected from the group consisting of Be, Mg, Ca, Sr, Ba, Ra, and combinations thereof. The filled skutterudite generally has the formula $A_xFe_yNi_zSb_{12}$, where $A_x$ represents the alkaline earth guest atoms 12, $Fe_yNi_z$ represents transition metal atoms 14, and $Sb_{12}$ represents antimonide atoms 16. As also shown in FIG. 1, the transition metal atoms 14 are at the center of distorted octahedra formed by six antimonide atoms 16, while the guest atoms 12 are located at the center of a cage formed by twelve antimonide atoms 16. According to the above formula, x is less than or approximately equal to one, and the sum of y and z is approximately equal to four. Optionally, A is represented by Ca, Sr or Ba, x is equal to 1.0, and y and z are equal to 3.0 and 1.0 respectively.

While described above as including a single category of alkaline earth guest atoms, the filled skutterudite 10 can optionally include two or three different alkaline earth guest atoms. For example, the filled skutterudite 10 can alternatively be designated by the formula $A1_{x1}A2_{x2}Fe_yNi_zSb_{12}$, where A1 and A2 are alkaline earth atoms, the sum of x1 and x2 is not more than approximately 1.0, and the sum of y and z is approximately 4.0. Where three alkaline earth elements are utilized, the filled skutterudite 10 can be designated by the formula $A1_{x1}A2_{x2}A3_{x3}Fe_yNi_zSb_{12}$, where A1, A2 and A3 are alkaline earth elements, the sum of x1, x2 and x3 is not more than approximately 1.0, and the sum of y and z is approximately 4.0. The filled skutterudite 10 of the present invention could further include other elements selected from the pnicogen group, including N, P, As, Bi, and combinations thereof, in place of antimony as noted above.

By filling the crystalline skutterudite structure 10 with alkaline earth guest atoms 12, the thermal conductivity, κ, of the filled skutterudite 10 is effectively reduced. As a result, the figure of merit, ZT, increases proportionally, owing to the anharmonic interactions between the alkaline earth atom 12 and the surrounding antimony atoms 16. In addition, suitable transition metal atoms 14 can include $Fe_3Ni$, though other stoichiometries can also be utilized where the sum of y and z is approximately equal to four. Such transition metal atoms can be advantageous over Fe—Co transition atoms, for example, as each Ni atom contributes two additional electrons relative to Fe as compared to one for Co. Thus, a lower concentration of Ni is needed when compared to filled skutterudites employing an $Fe_xCo_y$ structure. The filled skutterudite 10 may also be doped with one or more thermoelectric n-type or p-type doping materials to facilitate the production of excess electrons or electron holes, respectively.

The physical properties of filled skutterudite 10 of the present invention were recently examined and reported by the inventor of the present invention in "Properties of Alkaline-Earth-Filled Skutterudite Antimonides: A (Fe, Ni)$_4$Sb$_{12}$ (A=Ca, Sr and Ba)," David J. Singh and Mao-Hua Du, Phys. Rev. B. 82, 075115 (2010), the contents of which are hereby incorporated by reference in their entirety. In particular, the electronic structure, the Seebeck coefficient, and the vibrational densities of state of the filled skutterudite of the present invention were reported, revealing excellent thermoelectric characteristics. These properties of the filled skutterudite 10 of the present invention are briefly discussed below in connection with FIGS. 2-8.

I. ELECTRONIC STRUCTURE

Figure 2:
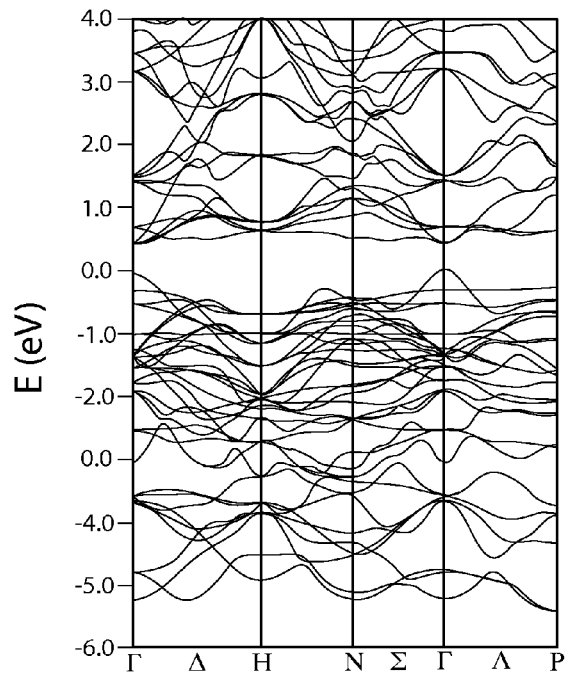
FIG. 2 is a graph depicting the virtual-crystal band structure of $SrFe_3NiSb_{12}$.

FIG. 2 illustrates the virtual-crystal band structure of $SrFe_3NiSb_{12}$ as obtained in a scalar relativistic approximation, where Sr is designated as the alkaline earth guest atom 12. The band structure reveals a modest gap semiconductor with a singly degenerate light valence-band maximum at F. The light valence band intersects heavier bands at a higher binding energy. The calculated (PBE-GGA) band gap is 0.42 eV, which is approximately 0.1 eV larger than the corresponding value for a rare earth filled cobalt skutterudite antimonide. Though not shown in FIG. 1, the calculated band gap for Ca filled and Ba filled skutterudite was determined to be 0.37 eV and 0.36 eV, respectively. Here too, the calculated band gaps are approximately 0.1 eV larger than the corresponding values attributed to rare earth filled skutterudites.

Figure 3:
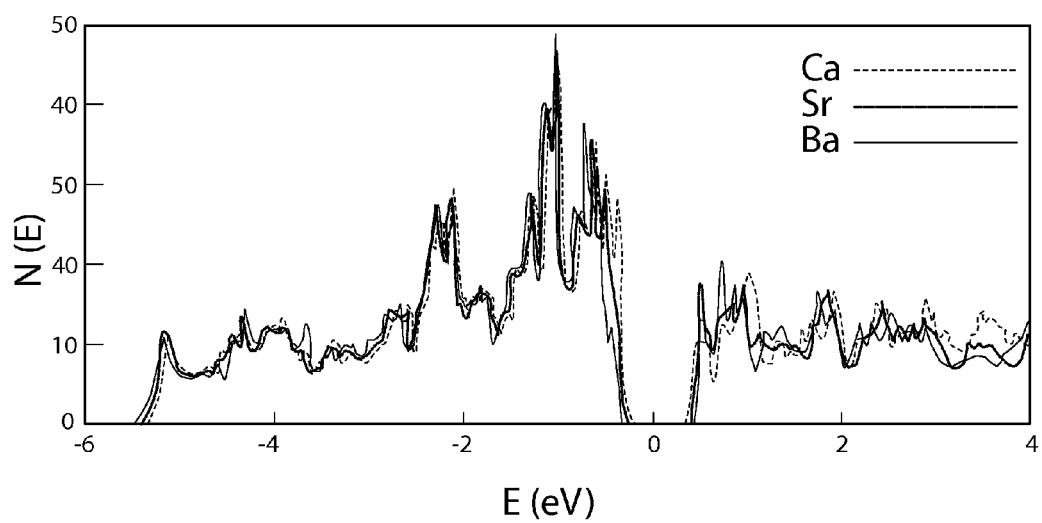
FIG. 3 is a graph depicting a comparison of the scalar relativistic electronic densities of states for virtual crystal $AFe_3NiSb_{12}$, where A=Cr, Sr or Ba.

FIG. 3 illustrates a comparison of the scalar relativistic electronic densities for $SrFe_3NiSb_{12}$, $CaFe_3NiSb_{12}$, and $BaFe_3NiSb_{12}$. The shape of the density states near the band edges for each filled skutterudite is substantially similar, indicating that the electrical properties of such compounds with optimized p-doping would be superior to p-type rare earth filled skutterudites. In addition, charge balancing for such p-doped alkaline earth filled skutterudites is accomplished with the transition elements 14 noted above (e.g., $Fe_3Ni$). Because alkaline earth elements are divalent, the use of an alkaline earth element in place of a trivalent rare earth element will normally require a higher cobalt concentration to obtain a semiconducting composition. However, the alkaline earth filled skutterudite of the present invention instead utilizes an Fe—Ni transition element alloy to charge balance, i.e., to maintain the desired electron count. Because each Ni atom contributes two additional electrons relative to Fe as compared to one for Co, a lower concentration of Ni is needed. Furthermore, Ni is significantly less expensive than Co, resulting in potential cost savings over rare earth filled Fe—Co skutterudites.

II. SEEBECK COEFFICIENT

The Seebeck coefficient, S(T), is a measure of the magnitude of an induced thermoelectric voltage in response to a temperature difference across the thermoelectric material. Because the figure of merit, ZT, is proportional to the square of the Seebeck coefficient, S(T), it is generally desirable to maximize the magnitude of the Seebeck coefficient of a thermoelectric material. As explained in greater detail below, the filled skutterudite of the present invention can achieve a Seebeck coefficient of −300 μV/K for n-type skutterudites, and can achieve a Seebeck coefficient of −200 μV/K for p-type skutterudites.

Figure 4A:
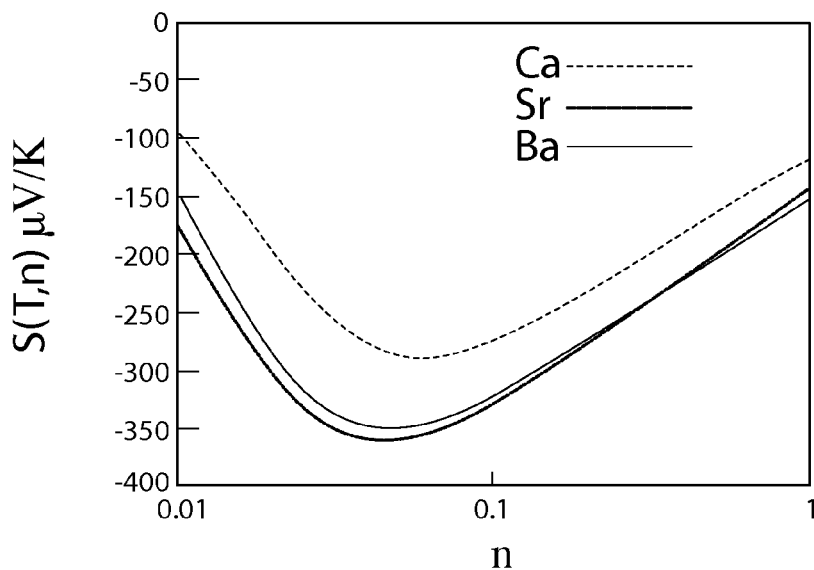
FIGS. 4A-4B are graphs depicting the Seebeck coefficient calculated as a function of carrier concentration at 900K for n-type $AFe_3NiSb_{12}$, where A=Cr, Sr or Ba.
Figure 4B:
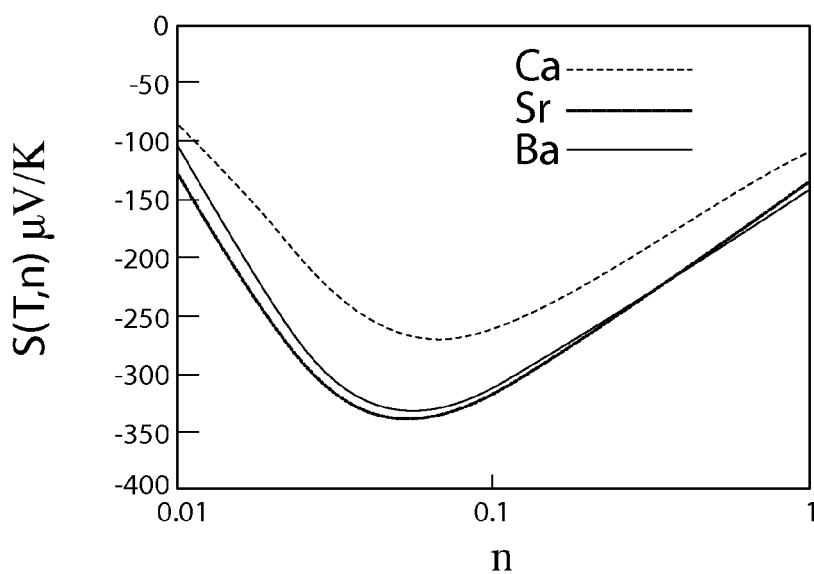
Figure 5A:
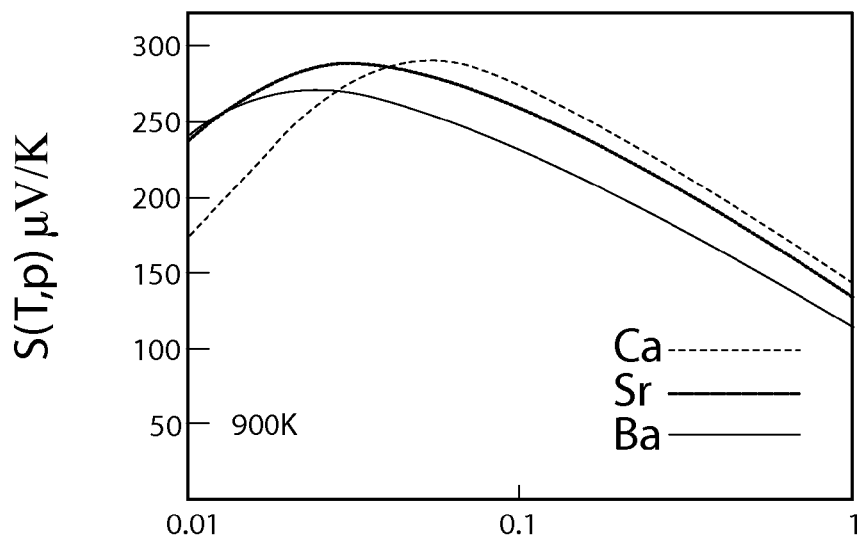
FIGS. 5A-5B are graphs indicating the Seebeck coefficient calculated as a function of carrier concentration at 900K for p-type $AFe_3NiSb_{12}$, where A=Cr, Sr or Ba.
Figure 5B:
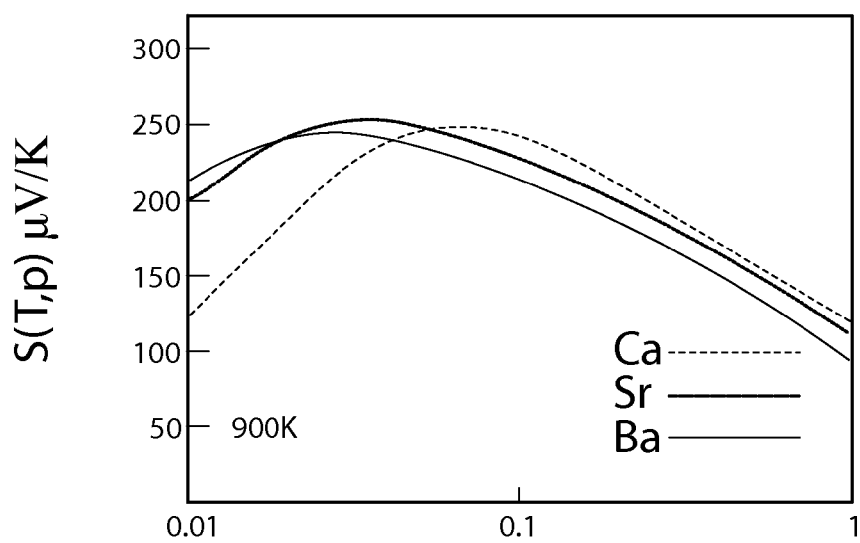

With reference to FIGS. 4A-B and 5A-B, the Seebeck coefficient is modeled as a function of carrier concentrations at 900 K for n-type and p-type skutterudites of $AFe_3NiSb_{12}$, where A=Ca, Sr, or Ba. More particularly, FIG. 4A plots the Seebeck coefficient for n-type compositions with a scalar relativistic band structure, while FIG. 4B plots the Seebeck coefficient for n-type compositions with a relativistic band structure including spin orbit. In like manner, FIG. 5A plots the Seebeck coefficient for p-type compositions with a scalar relativistic band structure, while FIG. 5B plots the Seebeck coefficient for 9-type compositions with a relativistic band structure including spin orbit.

For n-type compositions, the Seebeck coefficient is shown as achieving approximately −300 μV/K for Sr- and Ba-filled skutterudite antimonides and approximately −200 μV/K for a Ca-filled skutterudite antimonide, over a range of carrier concentrations from n=0.03 to n=0.2. Notably, the n-type Seebeck coefficient for Sr- and Ba-filled skutterudite antimonide is greater in magnitude than −200 μV/K up to n=0.5 per unit cell, with suggested carrier concentration for power generating applications at n=0.1-0.5 per unit cell. For p-type compositions, a Seebeck coefficient of approximately 200 μV/K is shown for Sr-, Br- and Ca-filled skutterudite antimonides in the concentration range p=0.02-0.1 per unit cell. While this is similar to the range of desirably high Seebeck coefficients for n-type compositions, the p-type filled skutterudite antimonide also involves the combination of heavy bands with a light band, which is a favorable case for carrier mobility. This favorable heavy-band, light-band combination is also reflected in the low carrier concentration regime.

III. VIBRATIONAL PROPERTIES

Figure 6A:
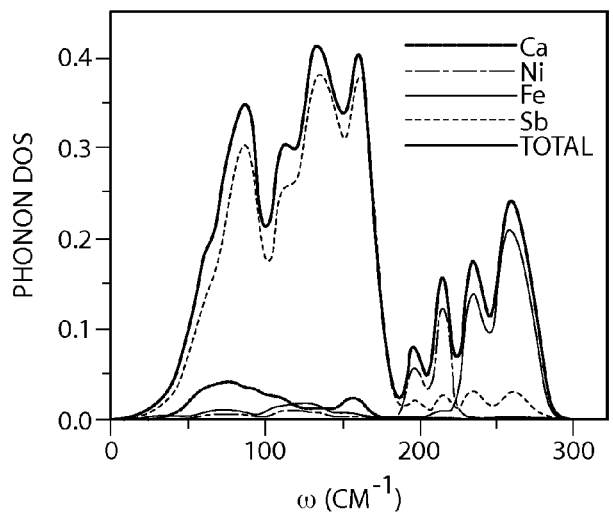
FIGS. 6A-6C are graphs showing the calculated vibrational density of states and site projections for ordered $AFe_3NiSb_{12}$, where A=Cr, Sr or Ba.
Figure 6B:
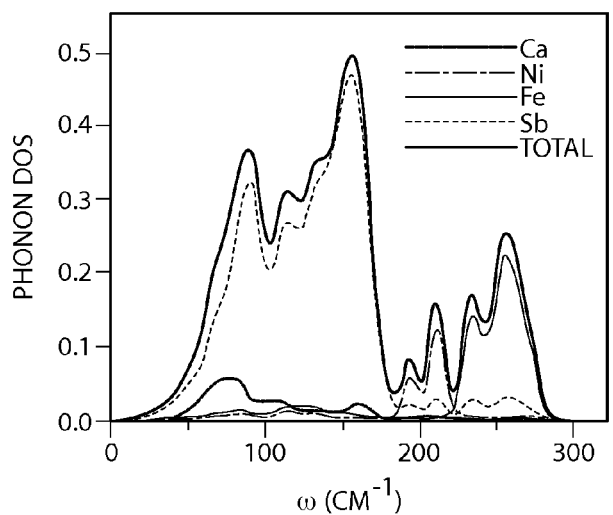
Figure 6C:
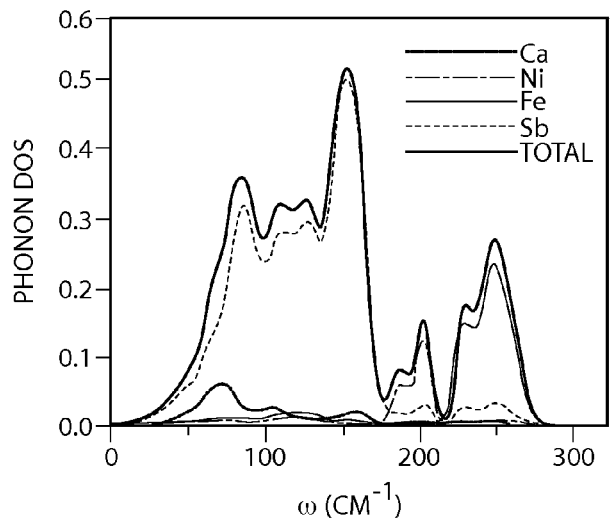
Figure 7:
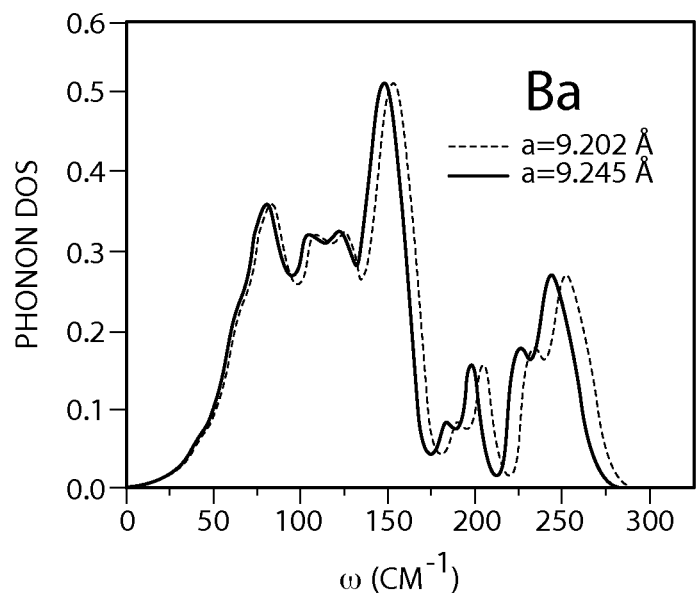
FIG. 7 is a graph showing a comparison of the vibrational density of states of $BaFe_3NiSb_{12}$ at lattice parameters a=9.245 and 9.202 Å.

The vibrational densities of states (DOS) of the filled skutterudite 10 of the present invention is shown in FIGS. 6-7. As explained below, the DOS for the thermoelectric material 10 reveals a reduced thermal conductivity, κ, over unfilled skutterudites, and therefore an improved figure of merit ZT over unfilled and potentially rare earth filled skutterudites.

With reference to FIG. 6A-C, the vibrational DOS is shown for $AFe_3NiSb_{12}$ cells, where A=Ca (FIG. 6A), A=Sr (FIG. 6B), and A=Ba (FIG. 6C), assuming a supercell lattice parameter of 9.245 Å. In the region below 150 cm$^{-1}$, which is thought to be the region most important for heat transport, the main vibrational peak associated with the alkaline earth guest atoms is approximately 80 cm$^{-1}$. The guest atoms are shown to have similar frequencies despite there different masses, owing to the lesser size of those guest atoms having a lesser mass. That is, for the smaller Ca alkaline earth guest atom, the rigidity of the skutterudite framework leaves it more room to vibrate (i.e., a softer potential) when compared to the larger Ba alkaline earth guest atom. In addition, FIG. 7 shows a comparison of the phonon density states for $BaFe_3NiSb_{12}$ at the relaxed supercell lattice parameter of 9.245 Å with the phonon density of states for $BaFe_3NiSb_{12}$ at the relaxed supercell lattice parameter of 9.202 Å. Only small changes in the DOS are found in the region below 150 cm$^{-1}$.

As noted above, the lattice thermal-conductivity reduction in filled skutterudites relative to unfilled skutterudite is attributable to anharmonic interactions between the guest atoms and the surrounding pnicogen group atoms. With alkaline earth filled skutterudites, the two-peak vibrational DOS of the guest atoms is also attributable to the anharmonic interactions between the guest atoms and the surrounding Sb atoms. That is, the two-peak structure in FIGS. 6A-6C arises from the mixing of alkaline earth and pnicogen vibrational modes. Even though the main guest atom frequencies are similar among different alkaline earth elements as shown in FIGS. 6A-C, the differing shapes of the projected phonon DOS reveal that the amount of mixing of vibrational modes is dependent upon the specific guest atom or atoms.

In sum, the filled skutterudite 10 of the present invention provides an artificially structured, modest band gap semiconductor having an increased Seebeck coefficient and a reduced thermal conductivity over known skutterudites. The filled skutterudite 10 may be utilized in a variety of thermoelectric applications and devices, including thermoelectric power generators, thermoelectric heaters or coolers, and thermocouples, for example. In addition, the use of nickel in place of cobalt and the use of alkaline earth elements in place of rare earth elements is shown to lower the material costs of the filled skutterudite. That is, in many applications alkaline earths will be much more available than heavy rare earths, nickel will be less expensive than cobalt, and a suitable semiconducting composition can be reached with less nickel than with cobalt.

Figure 8:
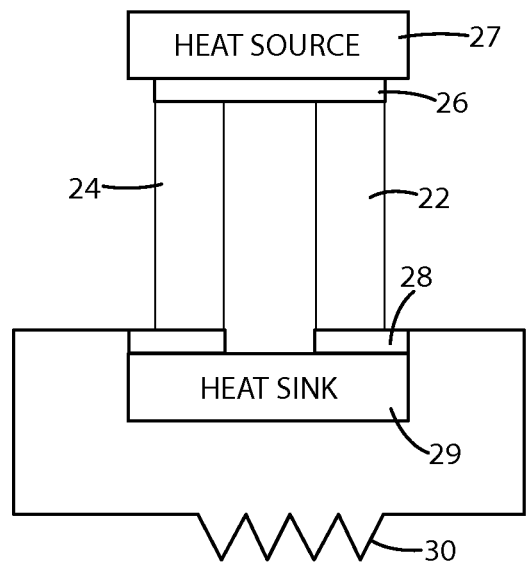
FIG. 8 schematically depicts a thermoelectric power generator including an alkaline earth filled nickel skutterudite antimonide thermoelectric material.

One example of a thermoelectric power generator utilizing the filled skutterudite 10 of the present invention is shown in FIG. 8 and generally designated 20. The thermoelectric power generator 20 includes an n-type alkaline earth filled nickel skutterudite antimonide semiconductor ("n-type semiconductor") 22 and a p-type alkaline earth filled nickel skutterudite antimonide semiconductor ("p-type semiconductor") 24. The n-type and p-type semiconductors 22, 24 are electrically connected in series and thermally connected in parallel. The thermoelectric power generator 20 includes a "hot" side that is in part defined by a first plate(s) or substrate(s) 26 adjacent a heat source 27. In addition, the thermoelectric power generator 20 includes a "cold" side that is in part defined by a second plate(s) or substrate(s) 28 adjacent a heat sink 29. The first and second plates 26, 28 can be formed of ceramic materials, though other suitable materials can also be utilized. A temperature gradient can be applied between the first (hot) plate 26 and the second (cold) plate 28. The temperature gradient promotes movement of the free electrons in the n-type semiconductor material 22 away from the hot plate 26 and toward the cold plate 28, creating an electric field therebetween. In like manner, the temperature gradient promotes movement of electron-holes in the p-type semiconductor material 24 away from the hot plate 26 and toward the cold plate 28, thereby creating an electric field therebetween.

When forming a closed circuit connected across a load 30, current flows in the direction indicated to provide a source of electrical power, thus converting thermal energy into electrical energy. The electrical power generation can be increased by increasing the magnitude of the temperature gradient or by increasing the figure of merit of each semiconductor 22, 24.

IV. CONCLUSION

The filled skutterudite of the present invention can achieve high thermoelectric performance at lower cost when compared with unfilled and rare earth filled skutterudites. In addition, the use of nickel in place of cobalt and the use of alkaline earth elements in place of rare earth elements is shown to lower the material costs of the filled skutterudite, because nickel is less expensive than cobalt and a semiconducting composition can be reached with less nickel than cobalt. The alkaline earth filled skutterudite can be effectively utilized as n-type and p-type semiconductors in any number of thermoelectric applications, including applications involving waste heat recovery from engines or industrial sources, solar thermal electrical power generation and solid state memory devices.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to elements in the singular, for example, using the articles "a," "an," "the," or "said," is not to be construed as limiting the element to the singular.

The invention claimed is:

1. A thermoelectric material comprising:
   a body centered cubic filled skutterudite having the formula $A_xFe_yNi_zSb_{12}$, wherein:
   A is an alkaline earth element;
   x is not more than approximately 1.0; and
   the sum of y and z is approximately 4.0.

2. The thermoelectric material of claim 1 wherein A is selected from the group consisting of Be, Mg, Ca, Sr, Ba, Ra and combinations thereof.

3. The thermoelectric material of claim 1 wherein x=1.0.

4. The thermoelectric material of claim 1 wherein y=3.0 and z=1.0.

5. The thermoelectric material of claim 1 wherein the filled skutterudite is n-doped with a Seebeck coefficient greater in magnitude than −170 µV/K at a temperature of 900 K for carrier concentrations of 0.1-0.5 per unit cell.

6. The thermoelectric material of claim 1 wherein the filled skutterudite is p-doped with a Seebeck coefficient greater in magnitude than 170 µV/K at a temperature of 900 K for carrier concentrations of 0.02-0.1 per unit cell.

7. The thermoelectric material of claim 1 wherein the filled skutterudite has a figure of merit greater than 1.0 for temperatures greater than 900 K.

8. A thermoelectric material comprising:
   a body centered cubic filled skutterudite having the formula $A1_{x1}A2_{x2}Fe_yNi_zSb_{12}$, wherein:
   A1 and A2 are alkaline earth elements;
   the sum of x1 and x2 is not more than 1.0; and
   the sum of y and z is approximately 4.0.

9. The thermoelectric material of claim 8 wherein A1 includes a first alkaline earth element and A2 includes a second alkaline earth element different from the first alkaline earth element.

10. The thermoelectric material of claim 8 wherein A1 and A2 are selected from the group consisting of Be, Mg, Ca, Sr, Ba, Ra and combinations thereof.

11. The thermoelectric material of claim 8 wherein the sum of x1 and x2 is substantially equal to 1.0.

12. The thermoelectric material of claim 8 wherein y=3.0 and z=1.0.

13. A thermoelectric material comprising:
   a body centered cubic filled skutterudite having the formula $A1_{x1}A2_{x2}A3_{x3}Fe_yNi_zSb_{12}$, wherein:
   A1, A2 and A3 are alkaline earth elements;
   the sum of x1, x2 and x3 is not more than 1.0; and
   the sum of y and z is approximately 4.0.

14. The thermoelectric material of claim 13 wherein A1, A2 and A3 each represent different alkaline earth elements selected from the group consisting of Be, Mg, Ca, Sr, Ba, Ra and combinations thereof.

15. The thermoelectric material of claim 13 wherein the sum of x1, x2 and x3 is substantially equal to 1.0.

16. The thermoelectric material of claim 13 wherein y=3.0 and z=1.0.

17. A thermoelectric device comprising:
   first and second heat transfer plates;
   n-type and p-type thermoelectric semiconductors disposed between the first and second heat transfer plates, the n-type and p-type thermoelectric semiconductors being electrically connected in series and thermally connected in parallel;
   wherein at least one of the n-type and p-type thermoelectric semiconductors include a body centered cubic filled skutterudite having the formula $A_xFe_yNi_zSb_{12}$, wherein A includes at least one alkaline earth element, x is not more than approximately 1.0, and the sum of y and z is approximately 4.0.

18. The thermoelectric power generator of claim 17 wherein y=3 and z=1.

19. The thermoelectric material of claim 17 wherein $A_x$ includes two alkaline earth elements according to the formula $A_x=A1_{x1}A2_{x2}$, wherein the sum of x1 and x2 is less than or approximately equal to 1.0.

20. The thermoelectric material of claim 17 wherein $A_x$ includes three alkaline earth elements according to the formula $A_x=A1_{x1}A2_{x2}A3_{x3}$, wherein the sum of x1, x2 and x3 is less than or approximately equal to 1.0.

* * * * *